(12) United States Patent
Kim

(10) Patent No.: US 8,248,872 B2
(45) Date of Patent: Aug. 21, 2012

(54) SEMICONDUCTOR MEMORY DEVICE AND TEST METHOD THEREOF

(75) Inventor: Kwi-Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 156 days.

(21) Appl. No.: 12/881,693

(22) Filed: Sep. 14, 2010

(65) Prior Publication Data

US 2012/0008441 A1    Jan. 12, 2012

(30) Foreign Application Priority Data

Jul. 7, 2010    (KR) .................... 10-2010-0065323

(51) Int. Cl.
*G11C 7/00*    (2006.01)
(52) U.S. Cl. .............. 365/200; 365/201; 365/225.7
(58) Field of Classification Search .......... 365/200, 365/201, 225.7
See application file for complete search history.

(56) References Cited

U.S. PATENT DOCUMENTS 6,704,228 B2 *    3/2004    Jang et al. ............ 365/200

FOREIGN PATENT DOCUMENTS

| KR | 10-0929847 | 11/2009 |
|---|---|---|
| KR | 10-0942971 | 2/2010 |

\* cited by examiner

*Primary Examiner* — Son Dinh
*Assistant Examiner* — Nam Nguyen
(74) *Attorney, Agent, or Firm* — IP & T Group LLP

(57) ABSTRACT

A semiconductor memory device includes a repair control signal generation unit configured to compare a repair target address programmed corresponding to a repair target memory cell with an external address, and generate a repair control signal. an address decoding unit configured to control a normal memory cell or a redundancy memory cell corresponding to the external address to be accessed in response to the repair control signal and an internal active signal, and an activation interval detection unit configured to generate an interval detection signal by detecting a time interval between an activation timing of the repair control signal and an activation timing of the internal active signal in a test operation mode.

32 Claims, 9 Drawing Sheets

SEMICONDUCTOR MEMORY DEVICE AND TEST METHOD THEREOF

CROSS-REFERENCE TO RELATED APPLICATIONS

The present application claims priority of Korean Patent Application No. 10-2010-0065323, filed on Jul. 7, 2010, which is incorporated herein by reference in its entirety.

BACKGROUND OF THE INVENTION

Exemplary embodiments of the present invention relate to a semiconductor design technology, and more particularly, to a semiconductor memory device including a fuse circuit in which an address corresponding to a repair target memory cell is programmed.

In general, a semiconductor memory device including a double data rate synchronous DRAM (DDR SDRAM) is provided with a large number of memory cells. As fabrication technologies have developed, the integration density of the semiconductor memory device gradually increases and the number of memory cells also gradually increases. When a fail occurs in any one of the memory cells, a corresponding semiconductor memory device may not perform a desired operation and thus may be discarded as a bad product. As fabrication technologies for semiconductor memory devices have advanced, a fail may occur in a few memory cells. If an entire semiconductor memory device is discarded as a bad product due to such fails, it may be inefficient in terms of the yield of products. In order to address such a concern, redundancy memory cells as well as normal memory cells are provided within a semiconductor memory device. When a fail occurs in a normal memory cell, it is replaced with a redundancy memory cell. A failed normal memory cell which is to be replaced with a redundancy memory cell may be referred to as a "repair target memory cell."

Meanwhile, a semiconductor memory device includes a fuse circuit which can program an address corresponding to a repair target memory cell (hereinafter, referred to as a repair target address). A programming refers to a series of operations for storing a repair target address in a fuse circuit.

In general, a fuse circuit includes a plurality of fuses. Representative methods for programming such fuses include a laser cutting method and an electrical cutting method. According to the laser cutting method, a cutting target fuse corresponding to a repair target address is blown and cut by a laser beam. According to the electrical cutting method, a cutting target fuse is melted and cut by applying an overcurrent thereto. The laser cutting method may be performed at a wafer level which is prior to a package level of a semiconductor memory device, and the electric cutting method may performed at a package level. Since the laser cutting method is simpler than the electrical cutting method, it is widely used. However, the electrical cutting method is also widely used because it can be used even after the packaging step.

As described above, the address corresponding to the repair target memory cell is programmed in the fuse circuit. That is, the repair target address is programmed in the fuse provided in the fuse circuit, and the semiconductor memory device performs the repair operation by using the repair target address. In other words, when an external address is for accessing the repair target memory cell, the semiconductor memory device compares the external address with the repair target address, and performs the repair operation to access the redundancy memory cell instead of the repair target memory cell according to the comparison result.

FIG. 1 is a diagram illustrating a conventional fuse set. As described below, a fuse circuit includes a plurality of fuse sets.

Referring to FIG. 1, the fuse set includes an enable fuse unit 110, zeroth to k-th fuse units 120 (where k is a natural number), and a fuse information summation unit 130.

The enable fuse unit 110 is configured to generate information indicating that repair target addresses are programmed in the zeroth to k-th fuse units 120. A logic level value of a fuse enable signal F#EN is determined according to whether or not an enable fuse F is cut. For reference, the enable fuse unit 110 receives a power-up signal PWR which is activated when an external power supply voltage VDD applied to the semiconductor memory device is higher than a certain voltage level.

The zeroth to k-th fuse units 120 are configured to compare the repair target addresses programmed in the respective fuse units with zeroth to k-th external addresses ADD#0, ADD#1, . . . , ADD#K, and generate zeroth to k-th address comparison signals F_ADD#0, F_ADD#1, . . . , F_ADD#K. The zeroth to kith fuse units 120 output the zeroth to k-th external addresses ADD#0, ADD#1, . . . , ADD#K as the zeroth to k-th address comparison signals F_ADD#0, F_ADD#1, . . . , F_ADD#K, or output the zeroth to k-th address comparison signals F_ADD#0, F_ADD#1, . . . , F_ADD#K by inverting the zeroth to k-th external addresses ADD#0, ADD#1, . . . , ADD#K, according to the repair target addresses programmed in the respective fuse units.

For convenience of explanation, a detailed circuit diagram of the k-th fuse unit 121 is illustrated in FIG. 1. The k-th fuse unit 121 outputs the k-th external address ADD#K as the k-th address comparison signal F_ADD#K, or outputs the k-th address comparison signal F_ADD#K by inverting the k-th external address ADD#K, according to whether or not a k-th address fuse F#K is cut.

The fuse information summation unit 130 is configured to sum the zeroth to k-th address comparison signals F_ADD#0, F_ADD#1, . . . , F_ADD#K, and generate a repair detection signal HITB. The repair detection signal HITB is activated when all of the zeroth to k-th address comparison signals F_ADD#0, F_ADD#1, . . . , F_ADD#K are activated because the repair target addresses programmed in the respective fuses of the zeroth to k-th fuse units 120 are equal to the zeroth to k-th external addresses ADD#0, ADD#1, . . . , ADD#K in such a state that the fuse enable signal F#EN is activated by the enable fuse F.

FIG. 2 is a block diagram illustrating a partial configuration of the semiconductor memory device including the fuse set of FIG. 1.

Referring to FIG. 2, the semiconductor memory device includes a repair control signal generation unit 210 and an address decoding unit 220.

The repair control signal generation unit 210 is configured to compare the repair target addresses programmed in the respective fuses with the zeroth to k-th external addresses ADD#<0:K>, and generate a repair control signal NXE. The repair control signal generation unit 210 includes a plurality of fuse sets 211 and a control signal output section 212.

The plurality of fuse sets 211 includes first to nth up fuse sets 211_U1, 211_U2, . . . , 211_Un and first to nth down fuse sets 211_D1, 211_D2, . . . , 211_Dn (where n is a natural number). The first to nth up fuse sets 211_U1, 211_U2, . . . , 211_Un and the first to nth down fuse sets 211_D1, 211_D2, . . . , 211_Dn have the structure of FIG. 1. The first to nth up fuse sets 211_U1, 211_U2, . . . , 211_Un and the first to nth down fuse sets 211_D1, 211_D2, . . . , 211_Dn are configured to compare the repair target addresses programmed in the respective fuse sets 211 with the zeroth to k-th external addresses ADD#<0:7>, and output first to nth up repair detection signals HITB_U#<1:n> and first to nth down repair detection signals HITB_D#<1:n>.

The control signal output section 212 is configured to receive the first to nth up repair detection signals HITB_U#<1:n> and the first to nth down repair detection signals HITB_D#<1:n>, and output the repair control signal NXE. The repair control signal NXE is activated when any one of the first to nth up repair detection signals HITB_U#<1:n> and the first to nth down repair detection signals HITB_D#<1:n>. That is, the repair control signal NXE is activated when the inputted zeroth to k-th external addresses ADD#<0:K> correspond to the repair target addresses.

The address decoding unit 220 is configured to decode the zeroth to k-th external addresses ADD#<0:K> to access normal memory cells or redundancy memory cells corresponding to the zeroth to k-th external addresses ADD#<0:K> under the control of the repair control signal NXE and an internal active signal BACT. The address decoding unit 220 includes first to nth up address decoding sections 220_U1, 220_U2, ..., 220_Un and first to nth down address decoding sections 220_D1, 220_, ..., 220_. The first to nth up address decoding sections 220_U1, 220_U2, ..., 220_Un and the first to nth down address decoding sections 220_D1, 220_D2, ..., 220_Dn can determine whether the inputted zeroth to k-th external addresses ADD#<0:K> correspond to the repair target memory cells in response to the repair control signal NXE, and control the normal memory cells or the redundancy memory cells to be accessed in response to the activation timing of the internal active signal BACT.

FIG. 3 is a timing diagram illustrating the circuit operation of the semiconductor memory device shown in FIG. 2.

Referring to FIG. 3, the zeroth to k-th external addresses ADD#<0:K> are inputted from the exterior in response to an active command ACT. At this time, normal addresses ADD_NOR corresponding to the normal memory cells or repair target addresses ADD_RED corresponding to the repair target memory cells may be inputted as the zeroth to k-th external addresses ADD#<0:K>. The zeroth to k-th external addresses ADD#<0:K> are inputted to the first to nth up fuse sets 211_U1, 211_U2, ..., 211_Un and the first to nth down fuse sets 211_D1, 211_D2, ..., 211_Dn of the repair control signal generation unit 210. The first to nth up fuse sets 211_U1, 211_U2, ..., 211_Un and the first to nth down fuse sets 211_D1, 211_D2, ..., 211_Dn compare the repair target addresses programmed in the respective fuses with the zeroth to k-th external addresses ADD#<0:K>, and activate the corresponding repair detection signals among the first to nth up repair detection signals HITB_U#<1:n> and the first to nth down repair detection signals HITB_D#<1:n>. Accordingly, the repair control signal NXE is activated. In FIG. 3, "tA" represents a time taken until the repair control signal NXE is generated after the zeroth to k-th external addresses ADD#<0:K> are inputted in response to the active command ACT.

As described in FIG. 3, the repair control signal NXE may have a logic high level or a logic low level. When the repair control signal NXE is at a logic high level, the zeroth to k-th external addresses ADD#<0:K> may correspond to the normal memory cells. When the repair control signal NXE is at a logic low level, the zeroth to k-th external addresses ADD#<0:K> may correspond to the repair target memory cells. When the repair control signal NXE is at a logic low level, that is, the zeroth to k-th external addresses ADD#<0: K> correspond to the repair target memory cells, the redundancy memory cells are accessed, instead of the normal memory cells.

The internal active signal BACT is a signal generated by delaying the active command ACT by a predetermined time. The internal active signal BACT controls an operation timing when the normal memory cells or the redundancy memory cells are accessed by the address decoding unit 220. As described in FIG. 3, the internal active signal BACT is to change from a logic low level to a logic high level after a state in which the repair control signal NXE is determined to a logic high level or a logic low level. The address decoding unit 230 controls the normal memory cells or the redundancy memory cells to be accessed in response to the internal active signal BACT which changes in the above-described manner. In FIG. 3, "tB" represents a time taken until the internal active signal BACT is activated after the active command ACT is inputted.

As described above, the internal active signal BACT is to be activated after the state in which the repair control signal NXE maintains a preset logic level value. The repair control signal NXE and the internal active signal BACT is a signal in which an asynchronous delay time is reflected. The repair control signal NXE is a signal in which the delay time tA corresponding to the circuit operation of the repair control signal generation unit 210 is reflected after the zeroth to k-th external addresses ADD#<0:K> are inputted, and the internal active signal BACT is a signal in which the delay time tB predetermined from the input of the active command ACT is reflected. In other words, the internal active signal BACT is desired to be activated after the repair control signal NXE is activated. That is, the delay time tA reflected in the repair control signal NXE is to also be reflected in the delay time tB from the input of the active command ACT to the generation of the internal active signal BACT.

The conventional semiconductor memory device does not have a test operation mode for measuring the delay time tB of the internal active signal BACT. Therefore, the delay time tB is estimated by an indirect method through a test operation mode for other purpose. Such a test operation mode is performed several times. In this manner, the delay time tB of the internal active signal BACT is determined. However, a relatively long test time is taken until a desired measurement value is obtained through such a test operation mode. Furthermore, since the reliability of the obtained measurement value is low, the activation timing of the internal active signal BACT is set to have a sufficient margin by further adding a time margin for a stable operation to the obtained measurement value. However, since such a method substantially delays the activation timing of the internal active signal BACT, the data access speed of the semiconductor memory device is lowered. Therefore, there is a demand for a circuit which more quickly and more accurately measures the delay time tB for which the active command ACT is delayed to generate the internal active signal BACT.

SUMMARY OF THE INVENTION

An embodiment of the present invention is directed to a semiconductor memory device which is capable of measuring the time for generating the repair control signal in response to external addresses inputted thereto.

The semiconductor memory device is also capable of obtaining the measurement value in which a delay time due to different signal transfer paths and a duty cycle ratio of a signal due to its polarity are reflected.

In accordance with an exemplary embodiment of the present invention, a semiconductor memory device includes a repair control signal generation unit configured to compare a repair target address programmed corresponding to a repair target memory cell with an external address, and generate a repair control signal, an address decoding unit configured to control a normal memory cell or a redundancy memory cell corresponding to the external address to be accessed in response to the repair control signal and an internal active signal, and an activation interval detection unit configured to generate an interval detection signal by detecting a time interval between an activation timing of the repair control signal and an activation timing of the internal active signal in a test operation mode.

In accordance with another exemplary embodiment of the present invention, a semiconductor memory device includes a repair control signal generation unit configured to receive an external address having first and second patterns and generate a repair control signal in a test operation mode, an address decoding unit configured to control a normal memory cell or a redundancy memory cell corresponding to the external address to be accessed in response to the repair control signal and an internal active signal, and an activation interval detection unit configured to generate interval detection signals according to the e the first and second patterns by detecting a time interval between an activation timing of the repair control signal and an activation timing of the internal active signal.

In accordance with yet another exemplary embodiment of the present invention, a semiconductor memory device includes a repair control signal generation unit configured to compare a repair target address programmed corresponding to a repair target memory cell with an external address, and generate a repair control signal, a plurality of address decoding units configured to control a normal memory cell or a redundancy memory cell corresponding to the external address to be accessed in response to the repair control signal and first and second internal active signals inputted through a first transfer path and a second transfer path, a first activation interval detection unit configured to generate a first interval detection signal by detecting a time interval between an activation timing of the repair control signal and an activation timing of the first internal active signal in a test operation mode, and a second activation interval detection unit configured to generate a second interval detection signal by detecting a time interval between the activation timing of the repair control signal and an activation timing of the second internal active signal in the test operation mode.

In accordance with still another exemplary embodiment of the present invention, a test method of a semiconductor memory device includes receiving an external address corresponding to a normal memory cell and an external address corresponding to a repair target memory cell, and generating a repair control signal, and detecting a time interval between an activation timing of the repair control signal and an activation timing of the internal active signal.

In accordance with further another exemplary embodiment of the present invention, a test method of a semiconductor memory device includes receiving a test address corresponding to a normal memory cell and an external address having a certain pattern, and generating a repair control signal, and detecting a time interval between an activation timing of the repair control signal and an activation timing of an internal active signal.

The semiconductor memory device in accordance with the embodiment of the present invention can quickly and accurately obtain the desired measurement value by directly measuring the time taken until the repair control signal is generated in response to the external address inputted thereto. The delay time of the internal active signal can be determined based on the measured time. Furthermore, the duty ratio according to the delay time due to the different transfer paths and the polarity of the external address can be reflected to the obtained measurement value.

DESCRIPTION OF SPECIFIC EMBODIMENTS

Figure 1:
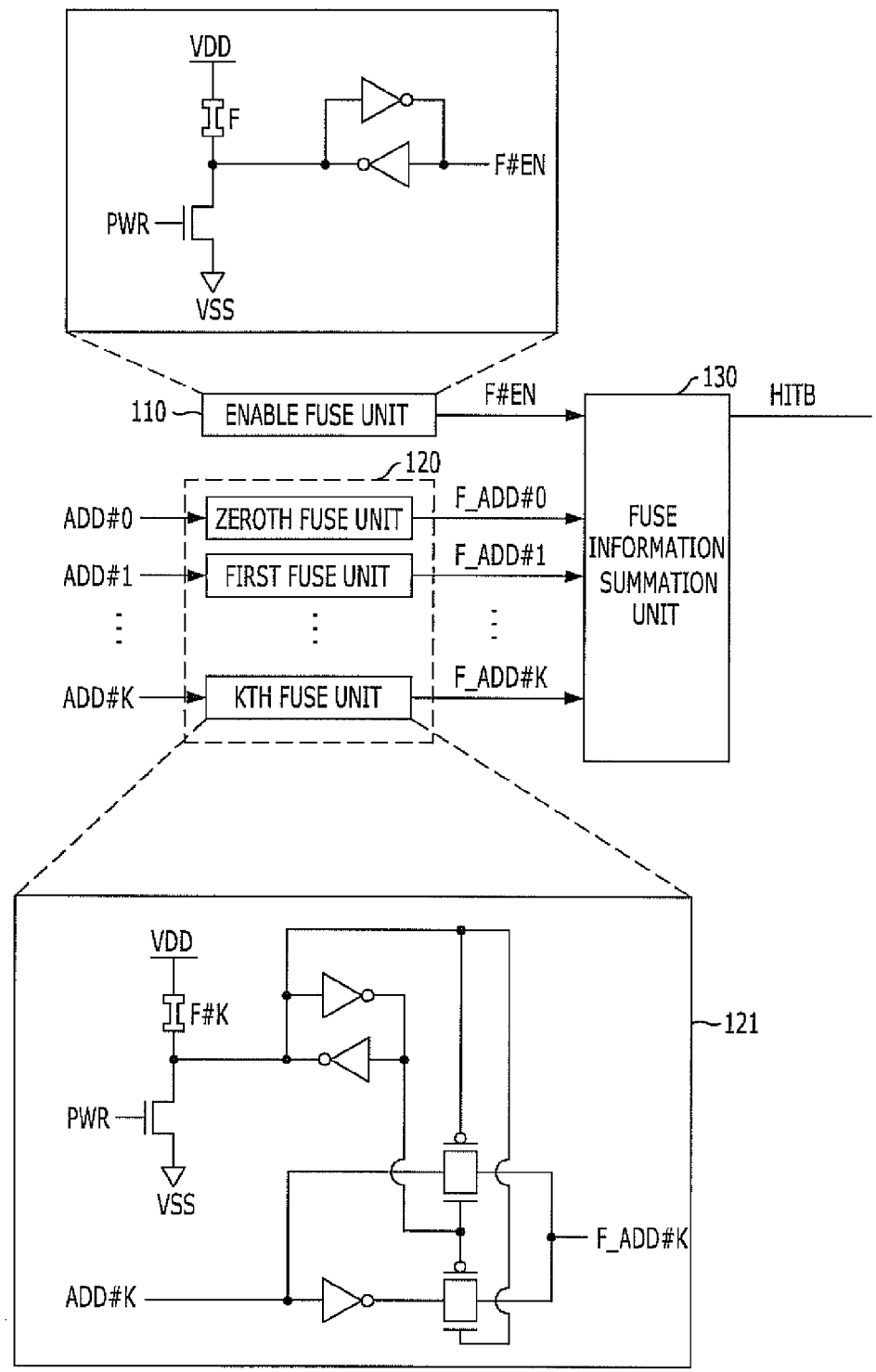
FIG. 1 is a diagram illustrating a conventional fuse set.
Figure 2:
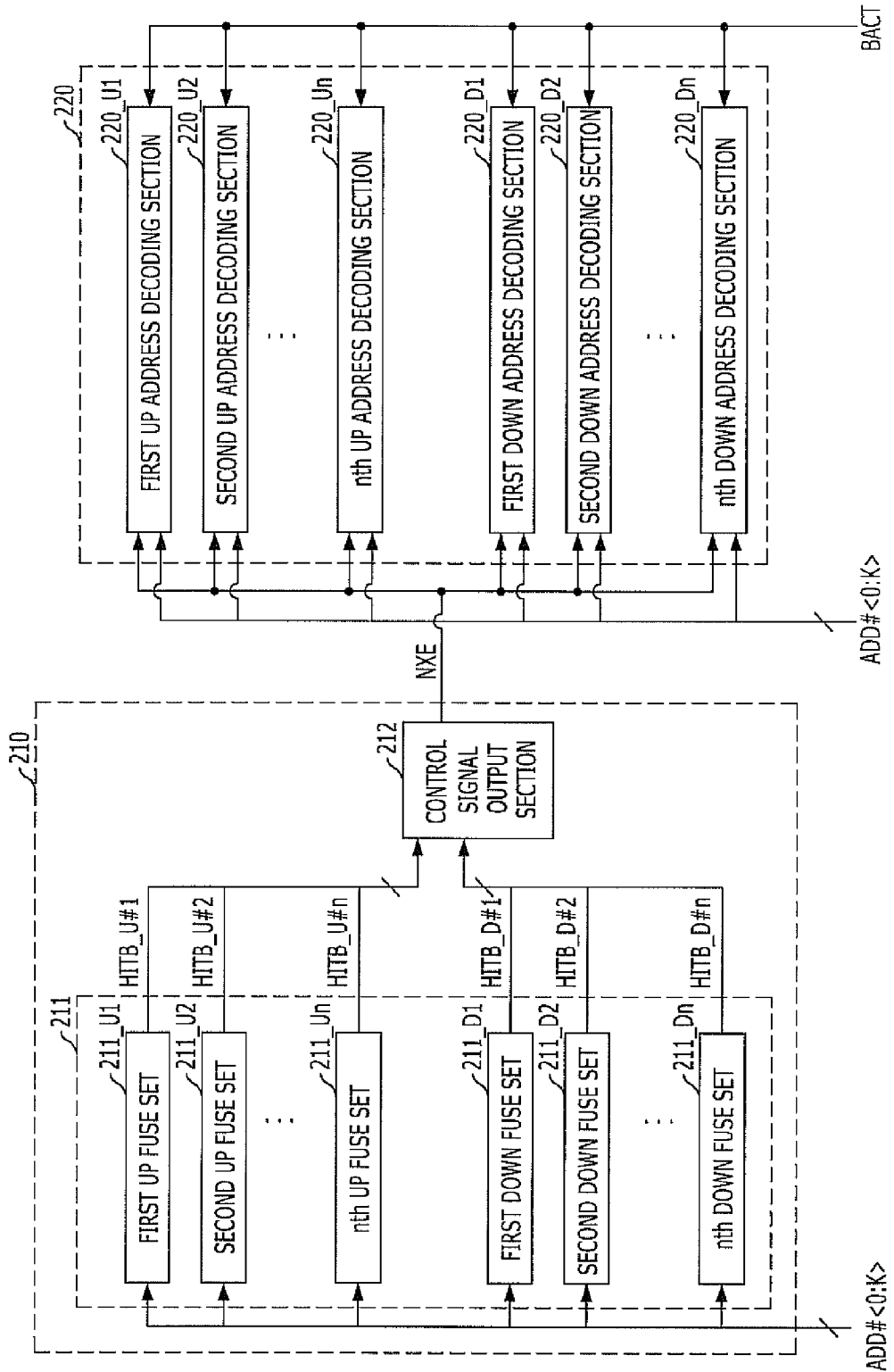
FIG. 2 is a block diagram illustrating a partial configuration of a semiconductor memory device including the fuse set of FIG. 1.
Figure 3:
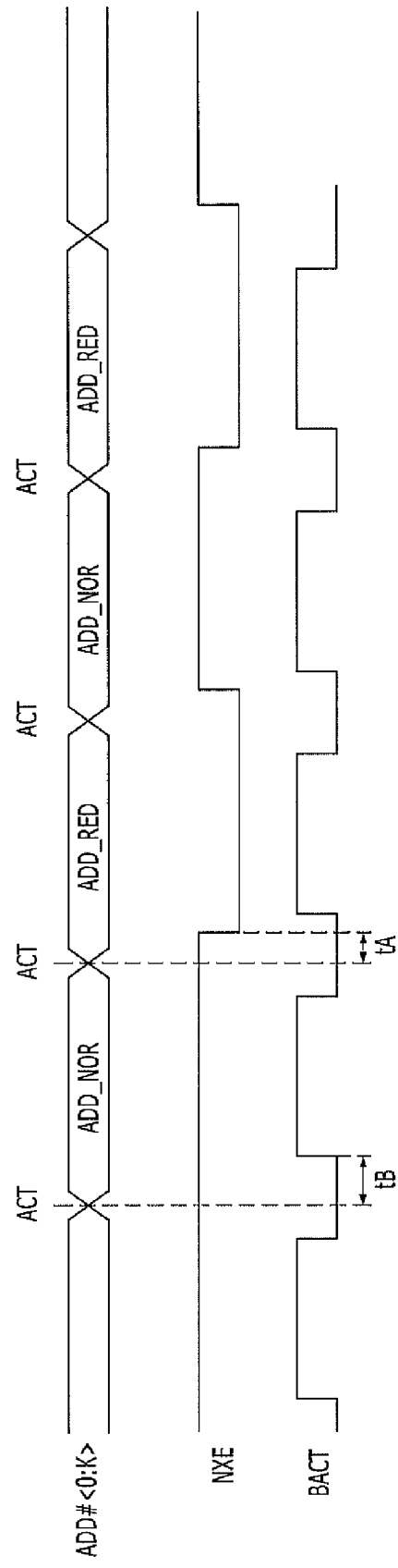
FIG. 3 is a timing diagram illustrating the circuit operation of the semiconductor memory device shown in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
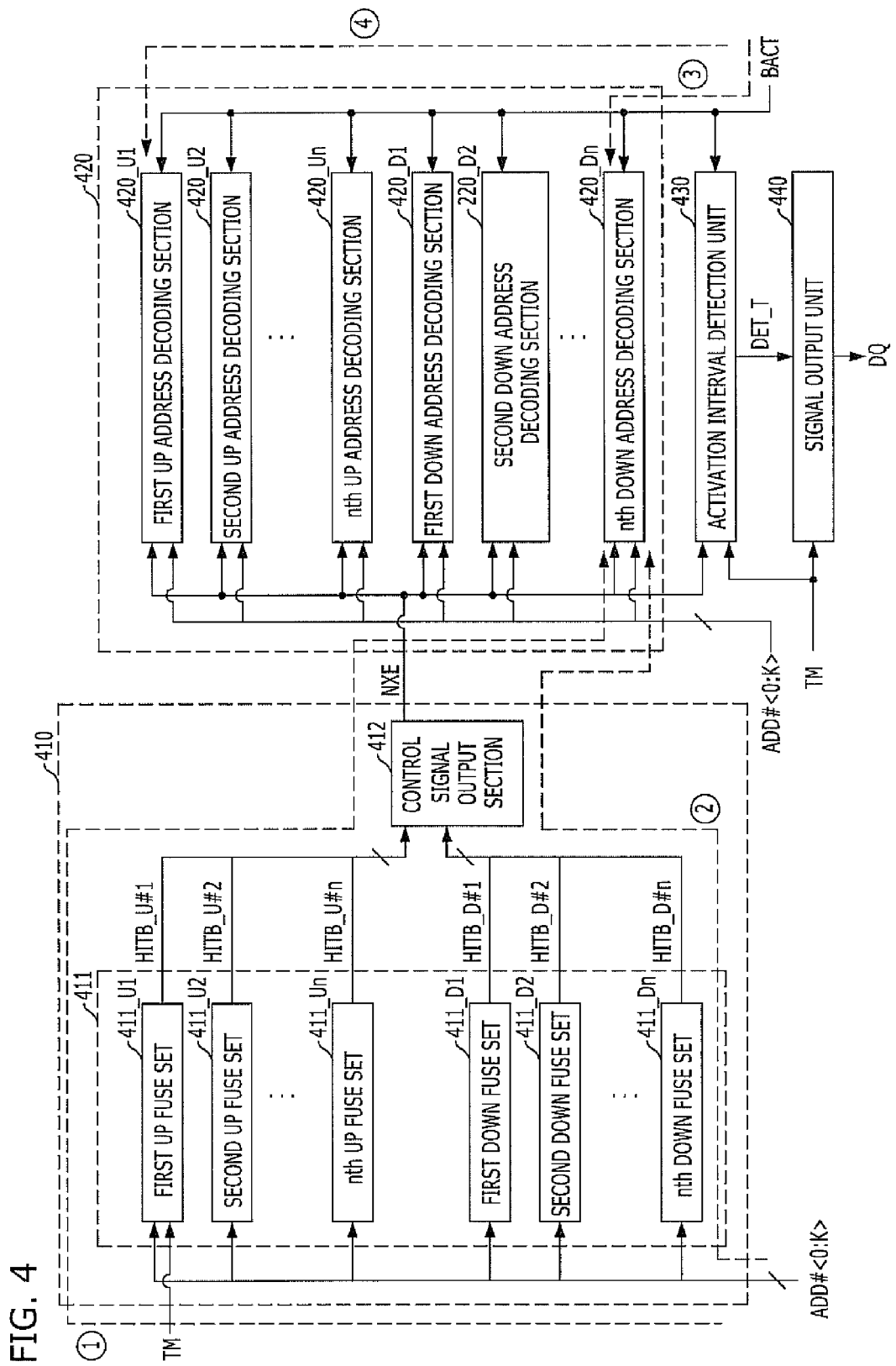
FIG. 4 is a block diagram illustrating a partial configuration of a semiconductor memory device in accordance with an embodiment of the present invention.

FIG. 4 is a block diagram illustrating a partial configuration of a semiconductor memory device in accordance with an embodiment of the present invention.

Referring to FIG. 4, the semiconductor memory device includes a repair control signal generation unit 410, an address decoding unit 420, an activation interval detection unit 430, and a signal output unit 440.

The repair control signal generation unit 410 is configured to compare repair target addresses programmed corresponding to repair target memory cells with the zeroth to k-th external addresses ADD#<0:K>, and generate a repair control signal NXE. The repair control signal generation unit 410 includes a plurality of fuse sets 411 and a control signal output section 412.

The plurality of fuse sets 411 includes first to nth up fuse sets 411_U1, 411_U2, . . . , 411_Un and first to nth down fuse sets 411_D1, 411_D2, . . . , 411_Dn configured to compare the repair target addresses with the zeroth to k-th external addresses ADD#<0:7>, and output a plurality of repair detection signals, that is, first to nth up repair detection signals HITB_U#<1:n> and first to nth down repair detection signals HITB_D#<1:n>. The circuit operation and circuit configuration of the first to nth up fuse sets 411_U1, 411_U2, . . . , 411_Un and the first to nth down fuse sets 411_D1, 411_D2, ..., 411_Dn is described in detail with reference to FIG. 7.

First, the circuit operation of the first to nth up fuse sets 411_U1, 411_U2, ..., 411_Un and the first to nth down fuse sets 411_D1, 411_D2, ..., 411_Dn is described briefly. The first to nth up fuse sets 411_U1, 411_U2, ..., 411_Un and the first to nth down fuse sets 411_D1, 411_D2, ..., 411_Dn include a plurality of fuses. The repair target addresses corresponding to the repair target memory cells are programmed in the respective fuses. Accordingly, in a normal operation mode, the first to nth up fuse sets 411_U1, 411_U2, ..., 411_Un and the first to nth down fuse sets 411_D1, 411_D2, ..., 411_Dn compare the repair target addresses programmed in the respective fuse sets 411 with the zeroth to k-th external addresses ADD#<0:K>, and output the first to nth up repair detection signals HITB_U#<1:n> and the first to nth down repair detection signals HITB_D#<1:n>.

As described in detail with reference to FIG. 7, the first up fuse set 411_U1 in accordance with the embodiment of the present invention toggles the first up repair detection signal HITB_U#1 in response to the first to k-th external addresses ADD#<0:K> and a test signal TM activated in a test operation mode. The first up fuse set 411_U1 is used in the test operation mode because the zeroth to k-th external addresses ADD#<0:K> are inputted to the first up fuse set 411_U1 though a relatively long input path compared to the plurality of fuse sets 411. If a fuse set other than the first up fuse set 411_U1 is disposed to have a longer input path when the zeroth to k-th external addresses ADD#<0:K> are inputted to the plurality of fuse sets 411, the corresponding fuse set may be used in the test operation mode.

Meanwhile, the control signal output section 412 is configured to receive the first to nth up repair detection signals HITB_U#<1:n> and the first to nth down repair detection signals HITB_D#<1:n>, which are outputted from the plurality of fuse sets 411, and output the repair control signal NXE. The repair control signal NXE is activated when any one of the first to nth up repair detection signals HITB_U#<1:n> and the first to nth down repair detection signals HITB_D#<1:n> is activated. That is, in the normal operation mode, the repair control signal NXE is activated when the inputted zeroth to k-th external addresses ADD#<0:K> are addresses corresponding to the repair target cells. As described above, in the semiconductor memory device in accordance with the embodiment of the present invention, the first up repair detection signal HITB_U#1 is activated in the test operation mode, and the control signal output section 412 is enabled in response to the first up repair detection signal HITB_U#1.

The address decoding unit 420 is configured to receive the zeroth to k-th external addresses ADD#<0:K> and control normal memory cells or redundancy memory cells corresponding to the zeroth to k-th external addresses ADD#<0:K> to be accessed in response to the repair control signal NXE and an internal active signal BACT. The address decoding unit 420 includes first to nth up address decoding sections 420_U1, 420_U2, ..., 420_Un and first to nth down address decoding sections 420_D1, 420_D2, ..., 420_Dn. The first to nth up address decoding sections 420_U1, 420_U2, ..., 420_Un and the first to nth down address decoding sections 420_D1, 420_D2, ..., 420_Dn can determine whether the inputted zeroth to k-th external addresses ADD#<0:K> correspond to the repair target memory cells in response to the repair control signal NXE, and control the normal memory cells or the redundancy memory cells to be accessed in response to the activation timing of the internal active signal BACT.

The activation interval detection unit 430 is configured to generate an interval detection signal DET_T by detecting a time interval between the activation timings of the repair control signal NXE and the internal active signal BACT in the test operation mode. The circuit configuration and circuit operation of the activation interval detection unit 430 is described in detail with reference to FIG. 5. The interval detection signal DET_T may have a pulse width defined by the activation timings of the repair control signal NXE and the internal active signal BACT inputted to the nth down address decoding section 420_Dn.

In other words, when considering that the repair control signal NXE is activated by the zeroth to k-th external addresses ADD#<0:K>, a time taken until the repair control signal NXE is activated and transferred to the nth down address decoding section 420_Dn in response to zeroth to k-th external addresses ADD#<0:k> is reflected in the activation timing of the interval detection signal DET_T, and a time taken until the internal active signal BACT is transferred to the nth down address decoding section 420_Dn after the repair control signal NXE is transferred to the nth down address decoding section 420_Dn is reflected to the pulse width of the interval detection signal DET_T.

For reference, the activation interval detection unit 430 is desired to be arranged adjacent to the nth down address decoding section 420_Dn. Such an arrangement makes it possible to directly measure the activation timings of the repair control signal NXE and the internal active signal BACT inputted to the nth down address decoding section 420_Dn.

The signal output unit 440 outputs the interval detection signal DET_T through a pad DQ in the test operation mode. A pad used in a test operation mode other than the test operation mode in accordance with the embodiment of the present invention may be used as the pad DQ. A pad used in the normal operation mode may be used. Several operation characteristics of the semiconductor memory device is can be analyzed by using the interval detection signal DET_T outputted through the pad DQ.

Figure 5:
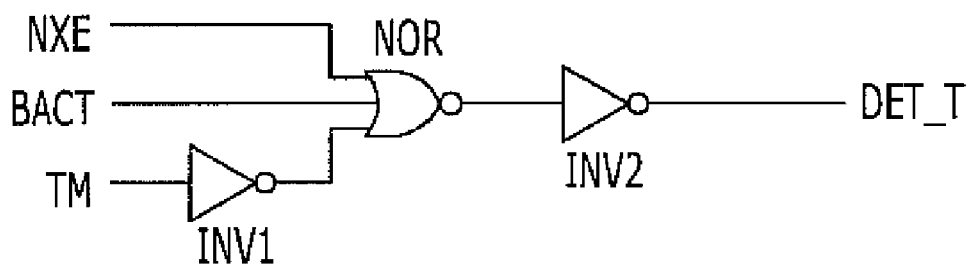
FIG. 5 is a detailed circuit diagram illustrating an activation interval detection unit of FIG. 4.

FIG. 5 is a detailed circuit diagram of the activation interval detection unit 430 shown in FIG. 4.

Referring to FIG. 5, the activation interval detection unit 430 includes a first inverter INV1, a NOR gate NOR, and a second inverter INV2. The first inverter INV1 is configured to receive a test signal TM. The NOR gate NOR is configured to receive the repair control signal NXE, the internal active signal BACT, and an output signal of the first inverter INV1. The second inverter INV2 is configured to invert an output signal of the NOR gate NOR and output the interval detection signal DET_T.

Therefore, in the test operation mode in which the test signal TM is activated to a logic high level, the interval detection signal DET_T changes from a logic high level to a logic low level in response to the repair control signal NXE, and changes from a logic low level to a logic high level in response to the internal active signal BACT. That is, the interval detection signal DET_T has a pulse width defined by the repair control signal NXE and the internal active signal BACT. The interval detection signal DET_T includes information about time for which the zeroth to k-th external addresses ADD#<0:K> are inputted and the repair control signal NXE is generated and arrives at the nth down address decoding section 420_Dn, and information about time for which the internal active signal BACT arrives at the nth down address decoding section 420_Dn after the repair control signal NXE arrives at the nth down address decoding section 420_Dn.

Figure 6:
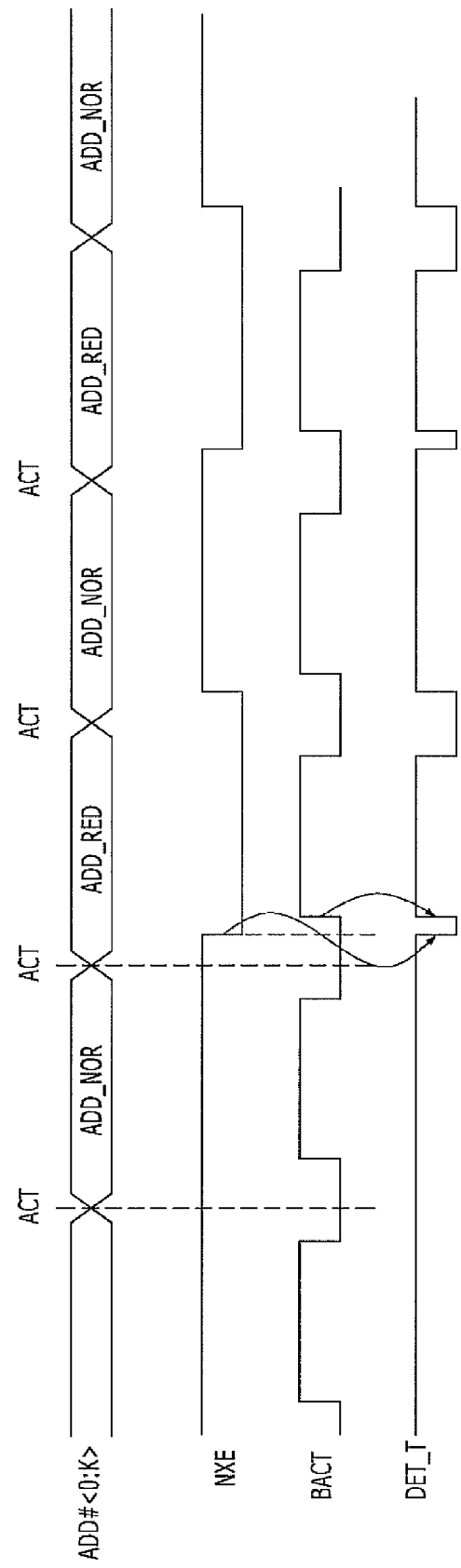
FIG. 6 is a timing diagram illustrating the operations of circuits shown in FIGS. 4 and 5.

FIG. 6 is a timing diagram explaining the operations of circuits shown in FIGS. 4 and 5.

Referring to FIG. 6, the zeroth to k-th external addresses ADD#<0:K> are inputted from the exterior in response to an active command ACT. The zeroth to k-th external addresses ADD#<0:K> are inputted to the repair control signal generation unit 410 and compared with the repair target addresses programmed in the respective fuses. As the comparison result, the repair control signal NXE is generated. When the repair control signal NXE is at a logic high level, the zeroth to k-th external addresses ADD#<0:K> may correspond to the normal memory cells. When the repair control signal NXE is at a logic low level, the zeroth to k-th external addresses ADD#<0:K> may correspond to the repair target memory cells. The internal active signal BACT is a signal generated by delaying the active command ACT by a predetermined time. The internal active signal BACT controls an operation timing when the normal memory cells or the redundancy memory cells are accessed by the address decoding unit 420.

The interval detection signal DET_T has a pulse width corresponding to the activation timing of the repair control signal NXE and the activation timing of the internal active signal BACT. The interval detection signal DET_T is outputted through the pad DQ.

Meanwhile, in order for the interval detection signal DET_T to have such a pulse width, the repair control signal NXE is to be toggled according to an input of the zeroth to k-th external addresses ADD#<0:K>. Therefore, as the zeroth to k-th external addresses ADD#<0:K> in the test operation mode, the normal address ADD_NOR corresponding to the normal memory cell and the repair target address ADD_RED programmed in the first up fuse set 411_U1 may be successively inputted.

The semiconductor memory device in accordance with the embodiment of the present invention can directly and precisely detect the time from the input of the zeroth to k-th external addresses ADD#<0:K> to the activation of the repair control signal NXE k-thin the test operation mode. Also, the semiconductor memory device in accordance with the embodiment of the present invention can directly and precisely detect the time from the activation of the repair control signal NXE to the activation of the internal active signal BACT. Therefore, the operation characteristics of the semiconductor memory device can be analyzed at high speed.

Meanwhile, as the operating speed of the semiconductor memory device increases, concerns which have not occurred at a low operating speed may be caused. For example, a signal transfer speed and a circuit operation speed may vary according to the polarity of the inputted signals.

The zeroth to k-th external addresses ADD#<0:K> have a logic low level or a logic high level. Thus, the signal transfer speed and the circuit operation speed may vary according to the polarity of the inputted external addresses. This means that the activation timing of the repair control signal NXE varies. Therefore, in order to more accurately measure the activation timing of the repair control signal NXE according to the polarity of the zeroth to k-th external addresses ADD#<0:K>, the measurement is to be separately performed in two cases: a case in which the repair target addresses programmed in the first up fuse set 411_U1 are a logic low level, and a case where the repair target addresses programmed in the first up fuse set 411_U1 are a logic high level.

In other words, the activation timing of the repair control signal NXE is measured when the zeroth to k-th external addresses ADD#<0:K> of a logic low level are inputted to the first up fuse set 411_U1. Next, the activation timing of the repair control signal NXE is measured when the zeroth to k-th external addresses ADD#<0:K> of a logic high level are inputted to the first up fuse set 411_U1. In order for such operations, fuse sets in which the repair target addresses of a logic low level are programmed, and fuse sets in which the repair target addresses of a logic high level are programmed may be separately provided. However, in this case, if the fuse sets occupying a relatively large area are separately arranged, a layout area increases, resulting in increase in the burden of the design. Therefore, the first up fuse set 411_U1 is proposed to activate the repair control signal NXE in the case where all the zeroth to k-th external addresses ADD#<0:K> are a logic low level and the case where all the zeroth to k-th external addresses ADD#<0:K> are a logic high level.

For reference, as described above, the repair control signal NXE is activated in response to any one of the plurality of repair detection signals generated from the plurality of fuse sets 411. In particular, the semiconductor memory device in accordance with the embodiment of the present invention toggles the repair control signal NXE according to the first up repair detection signal HITB_U#1 generated from the first up fuse set 411_U1 in response to the zeroth to k-th external addresses ADD#<0:K>. The reason for toggling the repair control signal NXE in response to the first up repair detection signal HITB_U#1 is described below in detail.

Figure 7:
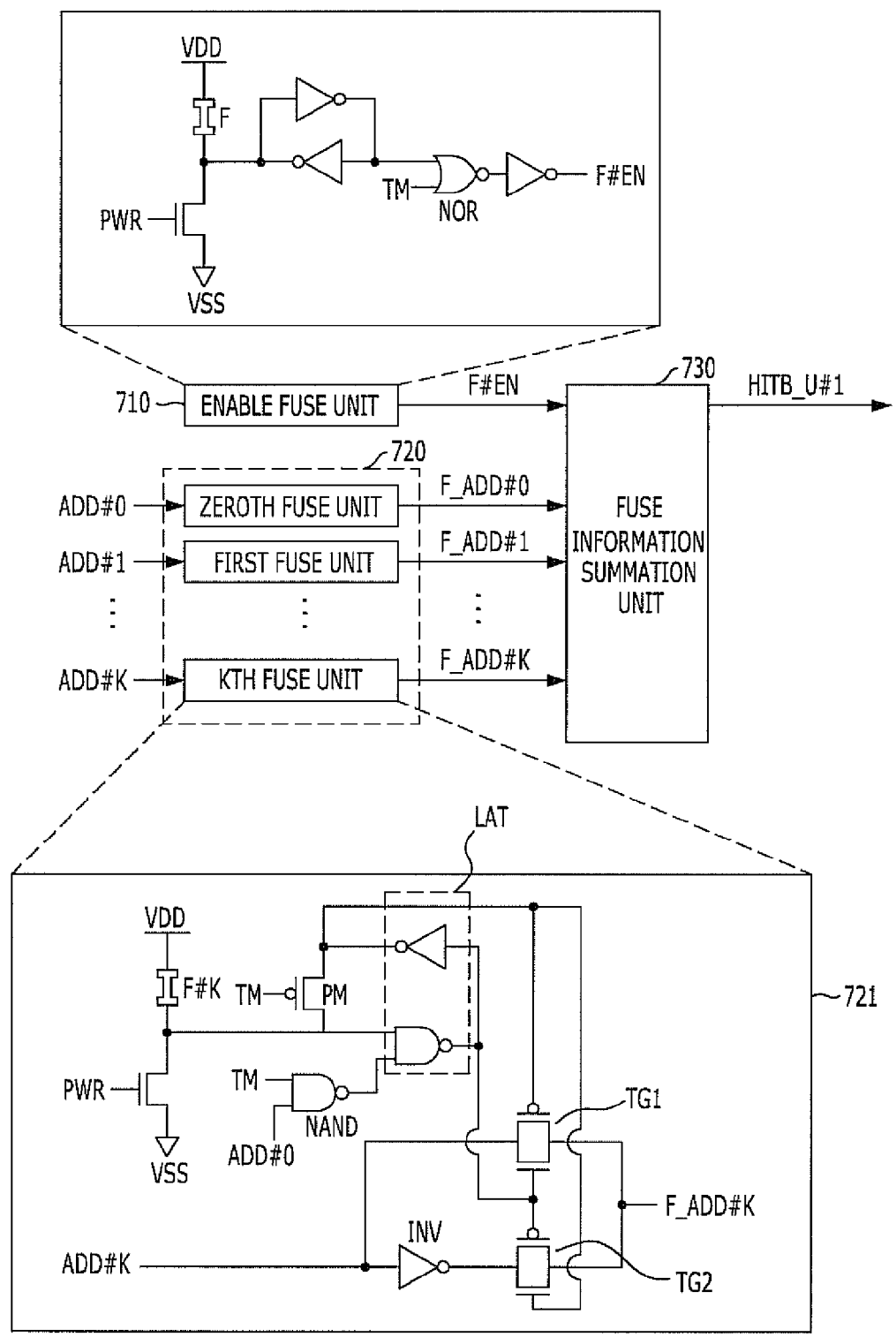
FIG. 7 is a circuit diagram illustrating a first up fuse set of FIG. 4.

FIG. 7 is a circuit diagram illustrating the first up fuse set 411_U1 of FIG. 4.

Referring to FIG. 7, the first up fuse set 411_U1 includes an enable fuse unit 710, zeroth to kith fuse units 720 (where k is a natural number), and a fuse information summation unit 730.

The enable fuse unit 710 is configured to generate information indicating that the zeroth to k-th fuse units 720 are programmed. In the normal operation mode, a logic level value of a fuse enable signal F#EN is determined according to whether or not an enable fuse F is cut. For reference, the enable fuse unit 710 receives a power-up signal PWR which is activated when an external power supply voltage VDD applied to the semiconductor memory device is higher than a certain voltage level. The enable fuse unit 710 in accordance with the embodiment of the present invention receives the test signal TM and activates the fuse enable signal F#EN in the test operation mode, regardless of whether or not the enable fuse F is cut. To this end, the enable fuse unit 710 includes a NOR gate NOR configured to receive the test signal TM. Through such a configuration, the fuse enable signal F#EN is activated to a logic high level while the test signal TM is at a logic high level.

The zeroth to k-th fuse units 720 are configured to compare the repair target addresses programmed in the respective fuses with the zeroth to k-th external addresses ADD#0, ADD#1, . . . , ADD#K, and generate zeroth to k-th address comparison signals F_ADD#0, F_ADD#1, . . . , F_ADD#K. In the normal operation mode, the zeroth to k-th fuse units 720 output the zeroth to k-th external addresses ADD#0, ADD#1, . . . , ADD#K as the zeroth to k-th address comparison signals F_ADD#0, F_ADD#1, . . . , F_ADD#K, or output the zeroth to k-th address comparison signals F_ADD#0, F_ADD#1, . . . , F_ADD#K by inverting the zeroth to k-th external addresses ADD#0, ADD#1, . . . , ADD#K, according to the repair target addresses programmed in the respective fuses.

For convenience of explanation, a detailed circuit diagram of the k-th fuse unit 721 is illustrated in FIG. 7. The k-th fuse unit 721 outputs the k-th external address ADD#K as the k-th address comparison signal F_ADD#K, or outputs the k-th address comparison signal F_ADD#K by inverting the k-th external address ADD#K, according to the whether or not a k-th address fuse F#K is cut.

The k-th fuse unit 721 in accordance with the embodiment of the present invention is configured to receive the test signal TM and the zeroth external address ADD#0, which is a representative external address. The k-th fuse unit 721 outputs the k-th external address ADD#K as the k-th address comparison signal F_ADD#K or outputs the k-th address comparison signal F_ADD#K by inverting the external k-th external address ADD#K in response to the zeroth external address ADD#0 in the test operation mode. To this end, the k-th fuse unit 721 includes an input section, a latching section LAT, an interruption section, and a selective output section. The input section is configured to input the zeroth external address ADD#0 to the latching section LAT. The interruption section is configured to interrupt a signal fed back from the latching unit LAT. The selective output section is configured to output the k-th external address ADD#K or the inverted k-th external address as the k-th address comparison signal F_ADD#K in response to an output signal of the latching section LAT. For reference, the latching section LAT performs an operation of latching information programmed in the k-th address fuse F#K in the normal operation mode.

The input section includes a NAND gate NAND configured to receive the test signal TM and the zeroth external address ADD#0, and the interruption section includes a PMOS transistor PM having a source and a drain coupled on the feedback path of the latching section LAT, and a gate receiving the test signal TM. The selective output section includes a first transmission gate TG1, an inverter INV, and a second transmission gate TG2. The first transmission gate TG1 is configured to transfer the k-th external address ADD#K as the k-th address comparison signal F_ADD#K in response to the output signal of the latching section LAT. The inverter INV is configured to invert the k-th external address ADD#K. The second transmission gate TG2 is configured to transfer an output signal of the inverter INV as the k-th address comparison signal F_ADD#K in response to the output signal of the latching section LAT.

The fuse information summation unit 730 is configured to sum the zeroth to k-th address comparison signals F_ADD#0, F_ADD#1, ..., F_ADD#K, and generate a first up repair detection signal HITB_U#1. In the normal operation, the first up repair detection signal HITB_U#1 is activated when all of the zeroth to k-th address comparison signals F_ADD#0, F_ADD#1, ..., F_ADD#K are activated because the repair target addresses programmed in the respective fuses of the zeroth to k-th fuse units 120 are equal to the zeroth to k-th external addresses ADD#0, ADD#1, ..., ADD#K in such a state that the fuse enable signal F#EN is activated by the enable fuse F. Also, in the test operation mode, the first up repair detection signal HITB_U#1 is activated when all of the zeroth to k-th address comparison signals F_ADD#0, F_ADD#1, ..., F_ADD#K are activated in such a state that the fuse enable signal F#EN is activated.

The operation of the first up fuse set 411_U1 of FIG. 7 in the test operation mode is described below. For convenience of explanation, it is assumed that the fuses provided in the fuse units are in a pre-programming state. That is, it is assumed that the fuses provided in the zeroth to k-th fuse units 720 are in an uncut state.

First, in the test operation mode, the test signal TM becomes a logic high level. Thus, the enable fuse 710 outputs the fuse enable signal F#EN of a logic high level in response to the test signal TM, regardless of the enable fuse F.

Meanwhile, when all of the zeroth to k-th external addresses ADD#0, ADD#1, ..., ADD#K are in a logic low level, the k-th fuse unit 721 receives the zeroth external address ADD#0 of a logic low level, and thus the second transmission gate TG2 is turned on. Therefore, the k-th address comparison signal F_ADD#K becomes the inversion signal of the k-th external address ADD#K. That is, since the k-th external address ADD#K is at a logic low level, the k-th address comparison signal F_ADD#K becomes a logic high level. Consequently, all of the zeroth to k-th address comparison signals F_ADD#0, F_ADD#1, ..., F_ADD#K outputted from the zeroth to k-th fuse units 720 are outputted at a logic high level. The fuse information summation unit 730 activates the first up repair detection signal HITB_U#1 in response to the zeroth to k-th address comparison signals F_ADD#0, F_ADD#1, ..., F_ADD#K.

Next, when all of the zeroth to k-th external addresses ADD#0, ADD#1, ..., ADD#K are at a logic high level, the k-th fuse unit 721 receives the zeroth external address ADD#0 of a logic high level, and thus the first transmission gate TG1 is turned on. Therefore, the k-th external address ADD#K is outputted as the k-th address comparison signal F_ADD#K. That is, since the k-th external address ADD#K is at a logic high level, the k-th address comparison signal F_ADD#K becomes a logic high level. Consequently, all of the zeroth to k-th address comparison signals F_ADD#0, F_ADD#1, ..., F_ADD#K outputted from the zeroth to k-th fuse units 720 are outputted at a logic high level. The fuse information summation unit 730 activates the first up repair detection signal HITB_U#1 in response to the zeroth to k-th address comparison signals F_ADD#0, F_ADD#1, ..., F_ADD#K.

As described above, the semiconductor memory device in accordance with the embodiment of the present invention activates the repair control signal NXE in response to the zeroth to k-th external addresses ADD#<0:K> of a logic high level in the test operation mode. Likewise, the semiconductor memory device in accordance with the embodiment of the present invention activates the repair control signal NXE in response to the zeroth to k-th external addresses ADD#<0:K> of a logic low level in the test operation mode.

Referring to FIG. 4, the repair control signal NXE is inputted to the activation interval detection unit 430, and the activation interval detection unit 430 generates the interval detection signal DET_T in response to the repair control signal NXE and the internal active signal BACT. In order for the interval detection signal DET_T to have the desired pulse width, the repair control signal NXE is be toggled according to the input of the zeroth to k-th external addresses ADD#<0:K>. Therefore, as the zeroth to k-th external addresses ADD#<0:K> in the test operation mode, the test addresses corresponding to normal memory cells and the addresses sequentially having all logic low and high level may be successively inputted. Detailed description thereof is made with reference to FIG. 8.

Figure 8:
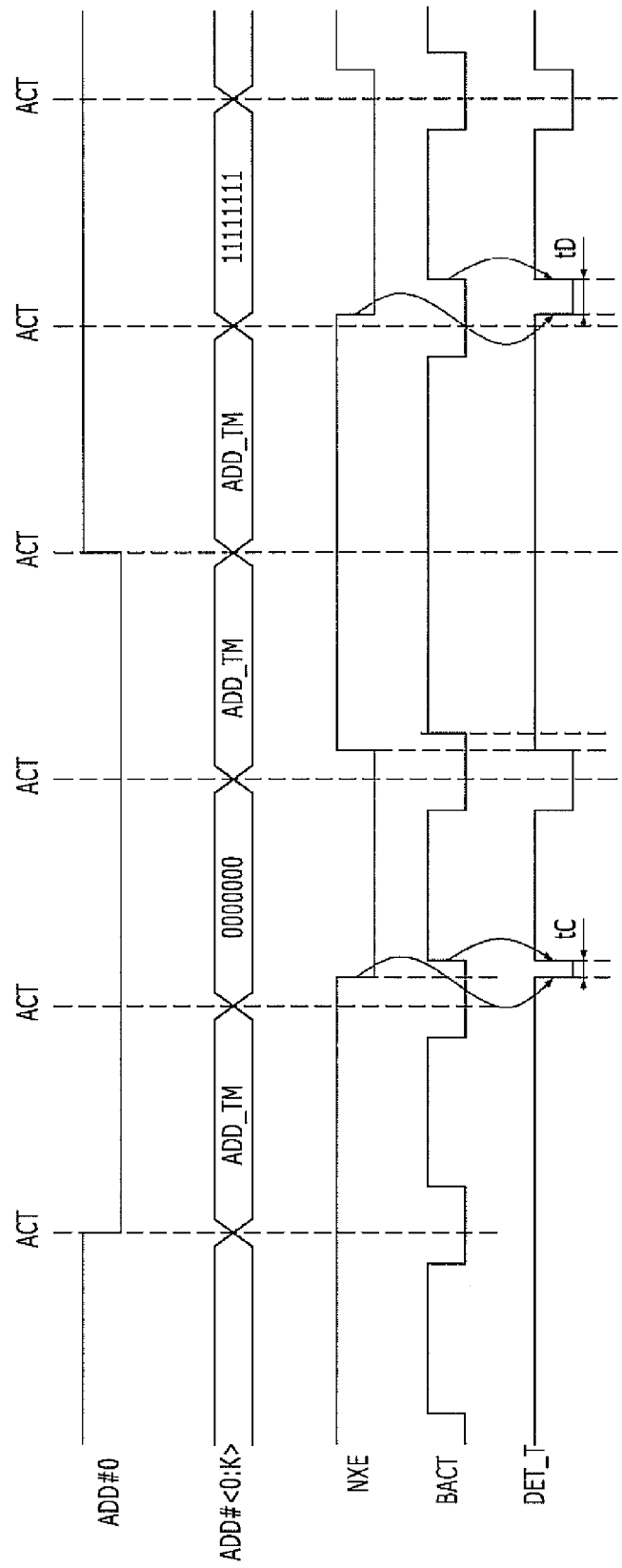
FIG. 8 is a timing diagram illustrating the operations of circuits shown in FIGS. 4 and 7.

FIG. 8 is a timing diagram illustrating the operations of circuits shown in FIGS. 4 and 7. For convenience of explanation, it is assumed that the zeroth to k-th external addresses ADD#<0:K> consist of 7 bits.

Referring to FIG. 8, the zeroth to k-th external addresses ADD#<0:K> are inputted from the exterior in response to the active command ACT. With respect to the zeroth to k-th external addresses ADD#<0:K>, the test address ADD_TM and the logic-low addresses "0000000" are successively inputted in the test operation mode to thereby generate the interval detection signal DET_T. At this time, the interval detection signal DET_T has a pulse width of "tC". Then, the test address ADD_TM and the logic-high addresses "1111111" are successively inputted to thereby generate the interval detection signal DET_T. At this time, the interval detection signal DET_T has a pulse width of "tD".

As described above, the reason why the interval detection signal DET_T has the different pulse width of "tC" and "tD" is that the signal transfer speed and the circuit operation speed vary according to the polarity of the zeroth to k-th external addresses ADD#<0:K>. As one example, in each case that all of the zeroth to k-th external addresses ADD#<0:K> are at a logic low level and a logic high level, the duty cycle ratio of the zeroth to k-th external addresses ADD#<0:K> may vary according to the signal transfer speed and the circuit operation speed. Thus, the activation timing of the repair control signal NXE also varies. That is, the pulse width of "tC" and the pulse width of "tD" may correspond to the duty cycle ratio of the zeroth to k-th external addresses ADD#<0:K>.

As described in FIG. 8, the interval detection signal DET_T has the pulse width of "tC" in correspondence to the zeroth to k-th external addresses ADD#<0:K> of "0000000" whose logic levels are all at a logic low level, and the interval detection signal DET_T has the pulse width of "tD" in correspondence to the zeroth to k-th external addresses ADD#<0:K> of "1111111" whose logic levels are all at a logic high level. Therefore, the activation timing of the internal active signal BACT after the activation of the repair control signal NXE can be detected fast and accurately, based on the interval detection signal DET_T, according to the polarity of the zeroth to k-th external addresses ADD#<0:K>.

The semiconductor memory device in accordance with the embodiment of the present invention can directly and precisely detect the time taken until the repair control signal NXE is activated according to the polarity of the zeroth to k-th external addresses ADD#<0:K>. Therefore, the activation timing of the internal active signal BACT can be optimized.

Meanwhile, as the operating speed of the semiconductor memory device gradually increases, a slight time difference may occur between the circuits which receive the same signal at the same timing. Referring to FIG. 4, for example, the zeroth to k-th external addresses ADD#<0:K> are inputted to the first to nth up fuse sets 411_U1, 411_U2, . . . , 411_Un and the first to nth down fuse sets 411_D1, 411_D2, . . . , 411_Dn. Through the respective circuit operations, the first to nth up repair detection signals HITB_U#1, HITB_U#2, . . . , HITB_U#n and the first to nth down repair detection signals HITB_D#1, HITB_D#2, . . . , HITB_D#n are outputted. The first to nth up repair detection signals HITB_U#1, HITB_U#2, . . . , HITB_U#n and the first to nth down repair detection signals HITB_D#1, HITB_D#2, . . . , HITB_D#n become the repair control signal NXE through the control signal output section 412. For example, the repair control signal NXE is inputted to the nth down address decoding section 420_Dn. Hereinafter, the respective signal transfer paths are described. The transfer path ① is the longest transfer path, and the transfer path ② is the shortest transfer path. As can be seen from the drawing, the lengths of the transfer path ① and the transfer path ② are different from each other. That the lengths of the transfer path ① and the transfer path ② are different from each other means that the times at which the repair control signals NXE outputted through the transfer path ① and the transfer path ② are inputted to the nth down address decoding section 420_Dn are different.

The internal active signal BACT is inputted to the first to nth up address decoding sections 420_U1, 420_U2, . . . , 420_Un and the first to nth down address decoding sections 420_D1, 420_D2, . . . , 420_Dn, and the lengths of the transfer path ③ and the transfer path ④ of the internal active signal BACT are also different from each other. That the lengths of the transfer path ③ and the transfer path ④ are different from each other means that the times at which the internal active signal BACT is inputted to the address decoding sections 420 are different.

Considering that the internal active signal BACT is to be activated after the repair control signal NXE is activated, the delay time reflected to the internal active signal BACT after the input of the active command is to ensure at least the time corresponding to the longest transfer path ①. For this reason, the semiconductor memory device in accordance with the embodiment of the present invention toggles the repair control signal NXE in the test operation mode by using the first up fuse set 411_U1. When the transfer path ① is not the longest transfer path, the repair control signal NXE may be toggled by controlling the fuse set corresponding to the longest transfer path.

The semiconductor memory device in accordance with the embodiment of the present invention measures the delay time corresponding to the longest transfer path ① through which the zeroth to k-th external addresses ADD#<0:K> are inputted to the corresponding address decoding section in the test operation mode, and measure the delay time corresponding to the shortest transfer path ③ through which the internal active signal BACT is inputted to the corresponding address decoding section. In this manner, the activation timings of the repair control signal NXE and the internal active signal BACT can be optimized. Therefore, in a case of the semiconductor memory device disposed as illustrated in FIG. 4, the activation interval detection unit 430 is arranged adjacent to the nth down address decoding section 420_Dn in order to accurately measure the delay times corresponding to the transfer path ① and the transfer path ③.

Meanwhile, the internal active signal BACT is designed to have a sufficient margin with respect to the repair control signal NXE at the early stage of the test operation mode. The internal active signal BACT is a factor related to tRCD defined in the specification with respect to the operation characteristics. When the internal active signal BACT is activated late, tRCT characteristic is degraded, lowering the speed of the data access operation of the semiconductor memory device. Thus, it is desired to detect diverse information in relation to the internal active signal BACT. To this end, there may be performed a method which measures the activation timing of the internal active signal BACT after the activation of the repair control signal NXE in correspondence to the first to nth up address decoding sections 420_U1, 420_U2, . . . , 420_Un and the first to nth down address decoding sections 420_D1, 420_D2, . . . , 420_Dn.

Using the semiconductor memory device of FIG. 4, the activation timing of the repair control signal NXE and the activation timing of the internal active signal BACT may be confirmed though the interval detection signal DET_T. At this time, information corresponding to the repair control signal NXE and the internal active signal BACT inputted to the nth down address decoding section 420_Dn is reflected to the interval detection signal DET_T. Therefore, in order to measure the activation timing of the internal active signal BACT after the activation of the repair control signal NXE in correspondence to the first to nth up address decoding sections 420_U1, 420_U2, . . . , 420_Un and the first to nth down address decoding sections 420_D1, 420_D2, . . . , 420_Dn, the activation interval detection unit 430 may be designed corresponding to the first to nth up address decoding sections 420_U1, 420_U2, . . . , 420_Un and the first to nth down address decoding sections 420_D1, 420_D2, . . . , 420_Dn. However, this method increases the burden of the circuit area. Therefore, in accordance with another embodiment of the present invention, the delay time corresponding to the shortest transfer path ③ and the longest transfer path ① may be measured without the increase in the burden of the circuit area.

Figure 9:
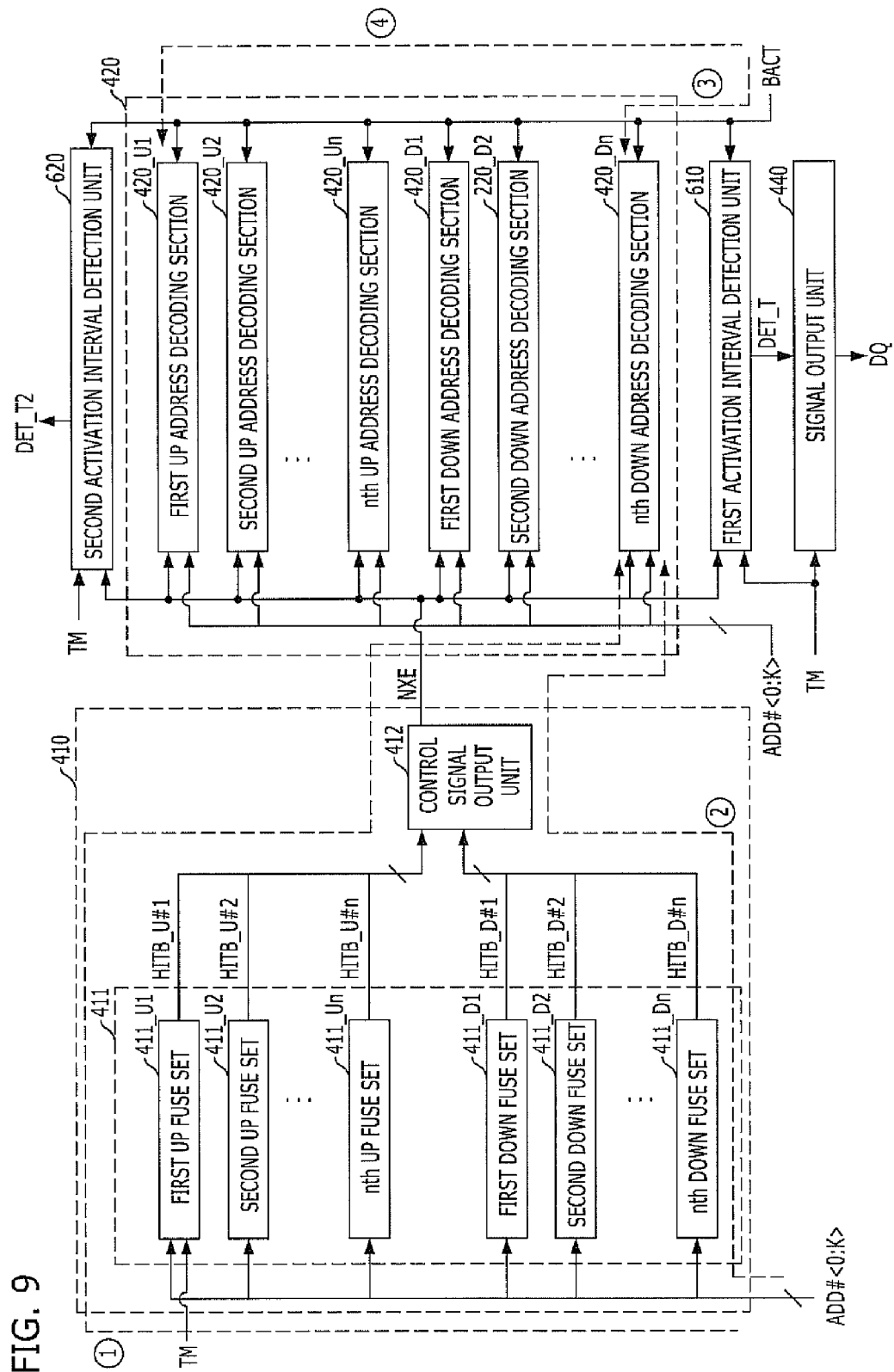
FIG. 9 is a block diagram illustrating a partial configuration of a semiconductor memory device in accordance with another embodiment of the present invention.

FIG. 9 is a block diagram explaining a partial configuration of a semiconductor memory device in accordance with another embodiment of the present invention. Like reference numerals are used to refer to like elements in FIGS. 4 and 9.

A first activation interval detection unit 610 is arranged adjacent to the nth down address decoding section 420_Dn. The first activation interval detection unit 610 is configured to generate a first interval detection signal DET_T1 by detecting a time interval between the activation timings of the repair control signal NXE and the internal active signal BACT transferred to the nth down address decoding section 420_Dn in the test operation mode. As described above with reference to FIG. 4, the first interval detection signal DET_T1 may have a pulse width defined by the activation timings of the repair control signal NXE and the internal active signal BACT inputted to the nth down address decoding section 420_Dn. That is, a time taken until the repair control signal NXE is activated and transferred to the nth down address decoding section 420_Dn through the transfer path ① in response to the zeroth to k-th external addresses ADD#<0:K> is reflected in the activation timing of the first interval detection signal DET_T1, and a time taken until the internal active signal BACT is transferred to the nth down address decoding section 420_Dn through the transfer path ① after the repair control signal NXE is transferred to the nth down address decoding section 420_Dn is reflected in the pulse width of the first interval detection signal DET_T1.

A second activation interval detection unit 620 is arranged adjacent to the first up address decoding section 420_U1. The second activation interval detection unit 620 is configured to generate a second interval detection signal DET_T2 by detecting a time interval between the activation timings of the repair control signal NXE and the internal active signal BACT transferred to the first up address decoding section 420_U1 in the test operation mode. The second interval detection signal DET_T2 has a pulse width as similar to the first interval detection signal DET_T2. That is, a time taken until the repair control signal NXE is activated and transferred to the first up address decoding section 420_U1 in response to the zeroth to k-th external addresses ADD#<0:K> is reflected in the activation timing of the second interval detection signal DET_T2, and a time taken until the internal active signal BACT is transferred to the first up address decoding section 420_U1 through the transfer path ④ after the repair control signal NXE is transferred to the first up address decoding section 420_U1 is reflected in the pulse width of the second interval detection signal DET_T2.

The second interval detection signal DET_T2 may be outputted through a pad different from the pad DQ through which the first interval detection signal DET_T1 is outputted. In order to output the first interval detection signal DET_T1 and the second interval detection signal DET_T2 through the same pad, the first activation interval detection unit 610 and the second activation interval detection unit 620 are designed to receive the test signals having different operation periods.

The semiconductor memory device in accordance with another embodiment of the present invention can measure the activation timings of the repair control signal NXE and the internal active signal BACT, which are inputted to the plurality of address decoding sections 420 through the different transfer paths, according to each address decoding section. Therefore, the delay time according to the different signal transfer paths is reflected in the values measured in the test operation mode.

As described above, the semiconductor memory device in accordance with the embodiment of the present invention can quickly and accurately measure the activation timing of the repair control signal NXE activated in response to the external addresses and the activation timing of the internal active signal BACT activated in response to the active command. Furthermore, the delay time due to the different transfer paths and the duty cycle ratio of the external addresses due to their polarity is reflected in the obtained measurement values. Therefore, the operation characteristics of the semiconductor memory device can be analyzed based on the measurement values obtained in the test operation mode, and the activation timings of the repair control signal NXE and the internal active signal BACT can be optimized.

In accordance with the embodiments of the present invention, the test time can be reduced by quickly and accurately measuring the time taken until the repair control signal is generated.

Moreover, the data access speed of the semiconductor memory device can be increased by optimizing the activation timing of the internal active signal.

While the present invention has been described with respect to the specific embodiments, it will be apparent to those skilled in the art that various changes and modifications may be made without departing from the spirit and scope of the invention as defined in the following claims.

Furthermore, the positions and types of the logic gates and transistors exemplified above in the foregoing embodiments may be differently implemented according to the polarities of the inputted signals.

What is claimed is:

1. A semiconductor memory device comprising:
    a repair control signal generation unit configured to compare a repair target address programmed corresponding to a repair target memory cell with an external address, and generate a repair control signal;
    an address decoding unit configured to control a normal memory cell or a redundancy memory cell corresponding to the external address to be accessed in response to the repair control signal and an internal active signal; and
    an activation interval detection unit configured to generate an interval detection signal by detecting a time interval between an activation timing of the repair control signal and an activation timing of the internal active signal in a test operation mode.

2. The semiconductor memory device of claim 1, further comprising a signal output unit configured to output the interval detection signal to an exterior of the semiconductor memory device in the test operation mode.

3. The semiconductor memory device of claim 1, wherein the repair control signal generation unit comprises:
    a plurality of fuse sets configured to compare the repair target address with the external address and output a plurality of repair detection signals; and
    a control signal output section configured to output the repair control signal in response to the plurality of repair detection signals.

4. The semiconductor memory device of claim 3, wherein any one of the plurality of fuse sets is configured to activate a corresponding repair detection signal in the test operation mode.

5. The semiconductor memory device of claim 4, wherein any one of the plurality of fuse sets receives the external address through the longest input path among input paths of the external address to the plurality of fuse sets.

6. The semiconductor memory device of claim 3, wherein any one of the plurality of fuse sets comprises:
   an enable fuse unit configured to activate a fuse enable signal in the test operation mode;
   a plurality of fuse units configured to compare the repair target address with the external address and generate a plurality of address comparison signals; and
   a fuse information summation unit configured to generate a corresponding repair detection signal in response to the fuse enable signal and the plurality of address comparison signals.

7. The semiconductor memory device of claim 1, wherein the interval detection signal has a pulse width defined by the activation timing of the repair control signal and the activation timing of the internal active signal.

8. The semiconductor memory device of claim 1, wherein the external address is defined by the successive input of an address corresponding to a normal memory cell and an address corresponding to the repair target memory cell in the test operation mode.

9. A semiconductor memory device comprising:
   a repair control signal generation unit configured to receive an external address having first and second patterns and generate a repair control signal in a test operation mode;
   an address decoding unit configured to control a normal memory cell or a redundancy memory cell corresponding to the external address to be accessed in response to the repair control signal and an internal active signal; and
   an activation interval detection unit configured to generate interval detection signals according to the first and second patterns by detecting a time interval between an activation timing of the repair control signal and an activation timing of the internal active signal.

10. The semiconductor memory device of claim 9, wherein the repair control signal generation unit is configured to compare a repair target address programmed corresponding to a repair target memory cell with the external address in a normal operation mode, and generate the repair control signal.

11. The semiconductor memory device of claim 9, wherein the repair control signal generation unit comprises:
   a plurality of fuse sets configured to compare the repair target address with the external address and output a plurality of repair detection signals; and
   a control signal output section configured to output the repair control signal in response to the plurality of repair detection signals,
   wherein any one of the plurality of fuse sets outputs a corresponding repair detection signal in response to the external address in the test operation mode.

12. The semiconductor memory device of claim 11, wherein the corresponding repair detection signal is activated in response to the external address having the first or second pattern.

13. The semiconductor memory device of claim 11, wherein any one of the plurality of fuse sets comprises:
   an enable fuse unit configured to activate a fuse enable signal in the test operation mode;
   a plurality of fuse units configured to generate a plurality of address comparison signals in response to the external address; and
   a fuse information summation unit configured to generate the corresponding repair detection signal in response to the fuse enable signal and the plurality of address comparison signals.

14. The semiconductor memory device of claim 13, wherein the plurality of fuse units is configured to output the external address as the plurality of address comparison signals in response to a representative external address corresponding to any one bit of the external address having multi-bits.

15. The semiconductor memory device of claim 14, wherein the plurality of fuse units each comprises:
   a latching section configured to latch information programmed in a fuse in a normal operation mode;
   an input section configured to input the representative external address to the latching section in the test operation mode;
   an interruption section configured to interrupt a signal fed back from the latching unit in the test operation mode; and
   a selective output section configured to output a corresponding address of the external address or an inverted corresponding address in response to an output signal of the latching section.

16. The semiconductor memory device of claim 9, wherein the external address is defined by the successive input of an address corresponding to the normal memory cells and an address having the first or second pattern in the test operation mode.

17. The semiconductor memory device of claim 9, wherein the external address having the first pattern is at a logic low level, and the external address having the second pattern is at a logic high level.

18. A semiconductor memory device comprising:
   a repair control signal generation unit configured to compare a repair target address programmed corresponding to a repair target memory cell with an external address, and generate a repair control signal;
   a plurality of address decoding units configured to control a normal memory cell or a redundancy memory cell corresponding to the external address to be accessed in response to the repair control signal and first and second internal active signals inputted through a first transfer path and a second transfer path;
   a first activation interval detection unit configured to generate a first interval detection signal by detecting a time interval between an activation timing of the repair control signal and an activation timing of the first internal active signal in a test operation mode; and
   a second activation interval detection unit configured to generate a second interval detection signal by detecting a time interval between the activation timing of the repair control signal and an activation timing of the second internal active signal in the test operation mode.

19. The semiconductor memory device of claim 18, further comprising:
   a first signal output unit configured to output the first interval detection signal to an exterior of the semiconductor memory device in response to a first test signal activated in the test operation mode; and
   a second signal output unit configured to output the second interval detection signal to the exterior of the semiconductor memory device in response to a second test signal activated in the test operation mode and having a different operation period from the first test signal.

20. The semiconductor memory device of claim 18, wherein different delay times according to the first and second transfer paths are reflected in the first and second internal active signals, respectively.

21. The semiconductor memory device of claim 18, wherein the first transfer path is the shortest transfer path among paths through which the internal active signal is transferred to the plurality of address decoding units, and the second transfer path is the longest transfer path among the paths.

22. The semiconductor memory device of claim 18, wherein the first interval detection signal has a pulse width defined by the activation timing of the repair control signal and the activation timing of the first internal active signal and the second interval detection signal has a pulse width defined by the activation timing of the repair control signal and the activation timing of the second internal active signal.

23. The semiconductor memory device of claim 18, wherein the first activation interval detection unit is arranged adjacent to the address decoding unit corresponding to the first transfer path among the plurality of address decoding units, and the second activation interval detection unit is arranged adjacent to the address decoding unit corresponding to the second transfer path among the plurality of address decoding units.

24. A test method of a semiconductor memory device, comprising:
 receiving an external address corresponding to a normal memory cell and an external address corresponding to a repair target memory cell, and generating a repair control signal; and
 detecting a time interval between an activation timing of the repair control signal and an activation timing of the internal active signal.

25. The test method of claim 24, wherein the external address corresponding to the normal memory cell and the external address corresponding to the repair target memory cell are successively inputted in a test operation mode.

26. The test method of claim 24, wherein the detecting of the time interval comprises:
 measuring a first time interval corresponding to the repair control signal and the internal active signal inputted through a first transfer path;
 measuring a second time interval corresponding to the repair control signal and the internal active signal inputted through a second transfer path; and
 outputting the first time interval and the second time interval.

27. The test method of claim 26, wherein the first time interval and the second time interval are outputted through different pads in a test operation mode, or outputted in a different period of the test operation mode.

28. The test method of claim 24, wherein an output signal in the detecting of the time interval has a pulse width defined by the activation timing of the repair control signal and the activation timing of the internal active signal.

29. A test method of a semiconductor memory device, comprising:
 receiving a test address corresponding to a normal memory cell and an external address having a certain pattern, and generating a repair control signal; and
 detecting a time interval between an activation timing of the repair control signal and an activation timing of an internal active signal.

30. The test method of claim 29, wherein the test address is different from the external address, and the test address and the external address are successively inputted.

31. The test method of claim 29, wherein the external address having the certain pattern is at a logic low level or a logic high level.

32. The test method of claim 29, wherein an output signal in the detecting of the time interval has a pulse width defined by the activation timing of the repair control signal and the activation timing of the internal active signal.

* * * * *